US008436682B1

(12) United States Patent  
Parkhurst et al.

(10) Patent No.: US 8,436,682 B1  
(45) Date of Patent: May 7, 2013

(54) FOURTH-ORDER ELECTRICAL CURRENT SOURCE APPARATUS, SYSTEMS AND METHODS

(75) Inventors: Charles Parkhurst, Murphy, TX (US); Mark Hamlyn, Melissa, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 13/279,042

(22) Filed: Oct. 21, 2011

(51) Int. Cl. *H03F 3/45* (2006.01)
(52) U.S. Cl. USPC .......................................... 330/261; 330/255
(58) Field of Classification Search ........... 330/252–261 See application file for complete search history.

(56) References Cited

U.S. PATENT DOCUMENTS

| | | |
|---|---|---|
| 6,710,654 B2 | 3/2004 | Parkhurst et al. |
| 7,078,962 B2 | 7/2006 | Parkhurst |
| 7,176,760 B2 * | 2/2007 | Jones .......................... 330/253 |

* cited by examiner

*Primary Examiner* — Hieu Nguyen  
(74) *Attorney, Agent, or Firm* — Alan A. R. Cooper; Wade J. Brady, III; Frederick J. Telecky, Jr.

(57) ABSTRACT

Apparatus and methods disclosed herein operate to receive a differential input signal at a first-stage pair of transconductance devices. The differential signal is amplified by a second-order factor at a positive-side or a negative-side first-stage transconductance device, depending upon the polarity of the differential input signal, to create a second-order signal at the output of the appropriate first-stage device. The second-order output signal is then amplified by another second-order factor at a corresponding second-stage transconductance device. A resulting fourth-order signal is made available at an output node as a quartic-response current source. The quartic-response current source may be utilized as a dynamic bias source in conjunction with a linear amplifier to provide a high slew rate amplifier.

20 Claims, 4 Drawing Sheets

FOURTH-ORDER ELECTRICAL CURRENT SOURCE APPARATUS, SYSTEMS AND METHODS

TECHNICAL FIELD

Embodiments described herein relate to apparatus and methods associated with electronic circuits, including structures and methods associated with dynamic current sources.

BACKGROUND INFORMATION

Linear amplifiers are used in a variety of applications, including, e.g., audio, video, and power supplies. Linearity between the amplifier input signal and the output signal enables the faithful reproduction of analog information presented at the amplifier input. A key metric associated with linearity and amplifier quality is slew rate, often expressed as volts per second (millivolts per microsecond, etc.). Slew rate is a measure of the maximum rate of change of the information signal at a particular point within the amplifier. A poor slew rate may result in a distorted output, as fast-changing portions of the information signal are delayed in time relative to other portions of the signal.

One application for which amplifier slew rate may be particularly important is that of regulating the output voltage of a switching DC-DC voltage converter. A switching DC downconverter (known in the art as a "buck" converter) alternately makes and breaks a circuit path between the converter DC supply input and an energy conversion inductor. During the ON state, the inductor stores energy in a magnetic field as current flows through the inductor. During the OFF state, the collapsing magnetic field generates current at the converter output. The inductor thus integrates the switched waveform to create an output voltage waveform proportional to the duty cycle of the active-state switched waveform. A filter capacitor is typically used to smooth the voltage waveform at the converter output.

To maintain a voltage set-point at the output of a DC-DC converter as load current demand changes, the output voltage level may be monitored and fed back to a circuit controlling the switching duty cycle. The slew rate of the DC-DC converter feedback circuit may be particularly important in applications requiring tight voltage regulation. For example, modern processors typically employ hundreds of millions of transistors. The on/off state of each transistor contributes to the overall instantaneous current load presented to the DC power supply. The instantaneous current load may be quite high and may change substantially within a few microseconds. And, low-voltage operation associated with today's microprocessor technology presents an additional challenge to DC power supply regulation requirements, given that small supply voltage variations may represent a significant percentage of a processor's operating voltage margin.

The slew rate of components associated with the output voltage controlling feedback loop in a DC-DC converter may limit the regulation precision of the converter. Signals applied to the differential inputs of the error amplifier typically include a reference voltage and a voltage divided sample of the converter output. The feedback error signal appears at the output of the error amplifier. Some error amplifiers use a "dynamic bias" current circuit and provide a variable current source as the error signal. The magnitude of the output current source is proportional to the magnitude of the difference between the reference voltage and the converter output sample voltages appearing at the error amplifier differential inputs.

SUMMARY OF THE INVENTION

Embodiments and methods herein operate as a voltage-controlled current source with a fourth-order transconductance response. A differential input signal is applied across the inputs of a first-stage pair of transconductance devices. A second-order replica of the input signal is produced at the output of one of the first-stage transconductance devices if the differential input signal is positive and at the output of the other first-stage transconductance device if the differential input signal is negative. The second-order signal is presented at the input of a corresponding second-stage transconductance device. The second-order input signal is proportionally replicated at the output of the second-stage transconductance device as a current source. The current source is capable of sourcing a magnitude of current quartically proportional to the differential input signal. Apparatus herein thus operate as fourth-order gm devices that may find use in very high slew rate applications.

As used herein, the term "transconductance device" means a device used in an electronic circuit to control electrical current as a function of a voltage input to the device. As such, transconductance devices may include semiconductor devices such as metal oxide semiconductor field effect transistors (MOSFETs) with gate, source, and drain terminals, and bipolar junction transistors with base, collector, and emitter terminals. Transconductance devices may also be embodied in vacuum tube devices, organic transistors, and other technologies. The terms "fourth order," "fourth-order response," and "quartic response" are used interchangeably herein.

DETAILED DESCRIPTION

Figure 1:
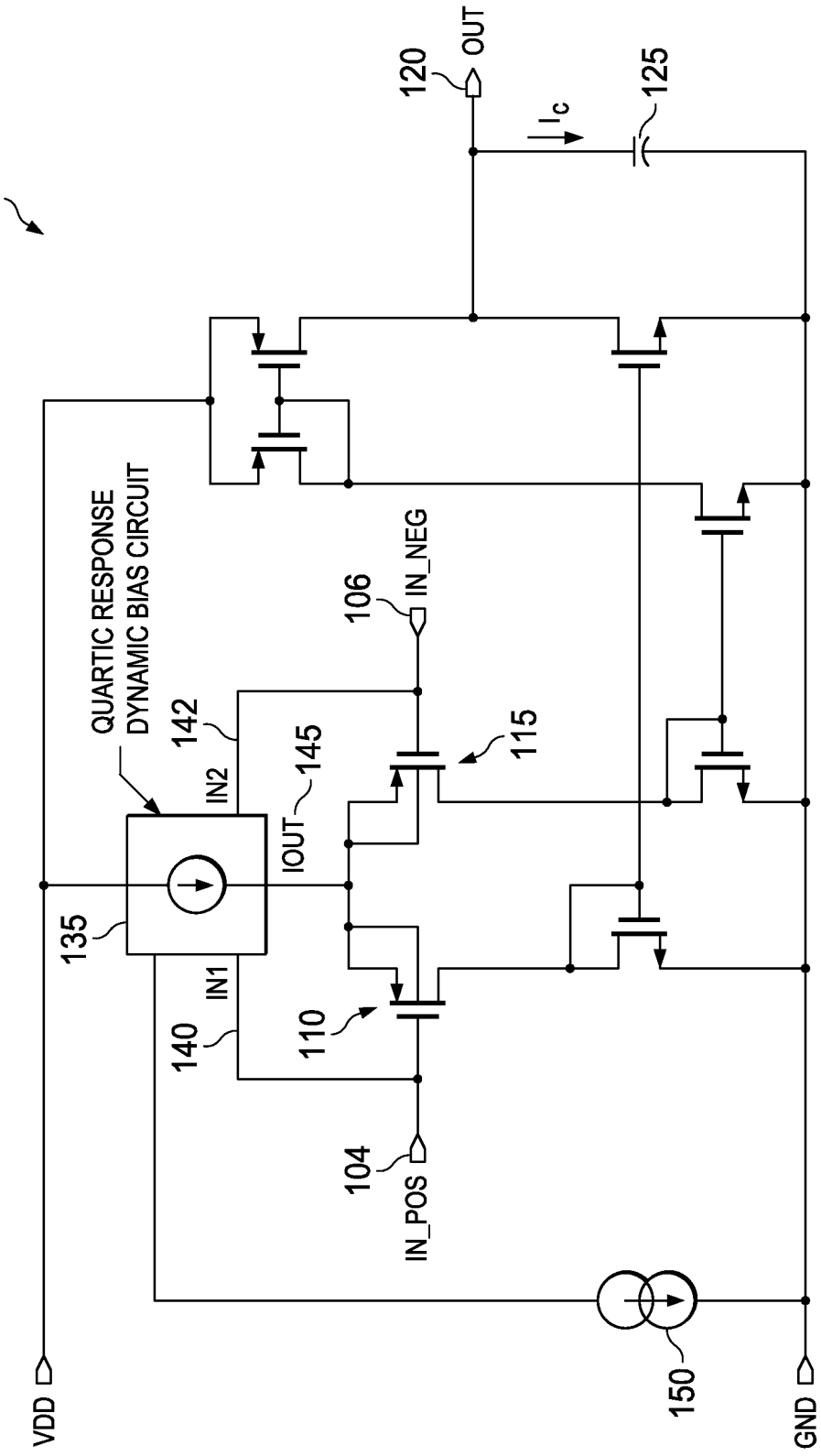
FIG. 1 is a schematic diagram of a differential-input linear amplifier employing a quartic-response dynamic bias current source according to various example embodiments of the invention.

FIG. 1 is a schematic diagram of a differential-input linear amplifier 100 employing a quartic-response dynamic bias current source 135 according to various example embodiments of the invention. The term "linear amplifier" in the context of these disclosures applies to operational amplifiers ("op-amps"), including op-amps used as components of feedback mechanisms of various circuits.

A differential signal may be applied across positive and negative inputs 104 and 106 corresponding to MOSFETs 110 and 115, respectively. A linearly-amplified replica of the input signal appears at a single-ended output 120 of the linear amplifier 100. Without more, however, slew rate at the output 120 could suffer due to loading effects associated with the compensation capacitor 125. More to the point, the output circuit requires a current source to charge the compensation capacitor 125; and the amplifier slew rate is a function of how quickly the compensation capacitor 125 can be charged.

The quartic response dynamic bias current source 135 provides current as needed to charge the compensation capacitor 125, as follows. The differential input signal is received at the dynamic bias current source 135 at differential inputs 140 and 142. The output current 145 available at the output node of the dynamic bias current source 135 is a fourth-order function of the differential input signal applied across terminals 140 and 142. The output current 145 is transferred through the amplifier by a series of current mirrors and is directed to charge or discharge the compensation capacitor 125 according to the polarity of the differential input signal. Current source 150 is a root current source distributed to various nodes within the dynamic bias block 135 as further described below.

Figure 2:
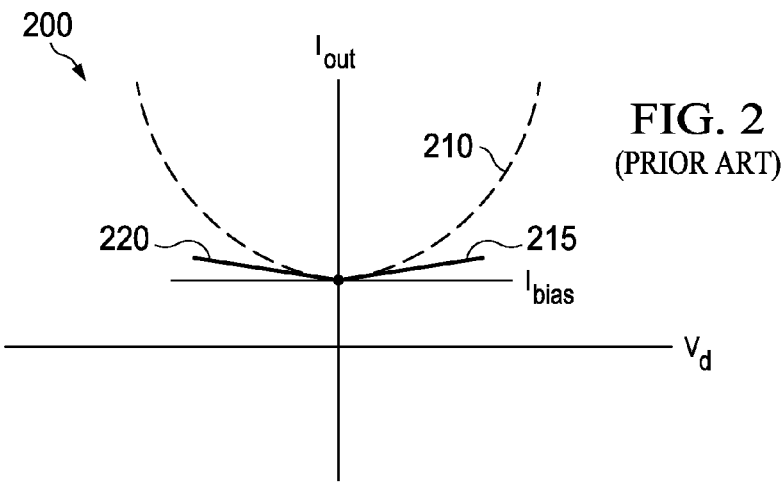
FIG. 2 is a prior-art transconductance (gm) plot of a traditional dynamic bias circuit.

FIG. 2 is a prior-art transconductance (gm) plot 200 from a traditional second-order dynamic bias circuit as might be used in a linear amplifier application as previously described. The plot 200 shows a second-order current response 210 (quadratic for MOSFETs, exponential for bipolar junction technology, etc.) that is significant for larger differential input voltage values. However, for very small differential input voltages, on the order of a few millivolts for example, the second-order current response 210 is practically linear. The latter characteristic is depicted as small-angle tangent lines 215 and 220 representing very small transconductance values corresponding to very small positive and negative differential voltages. Such small transconductance values may be inadequate for high slew-rate, small-signal applications such as the DC-DC converter application discussed above.

Figure 3:
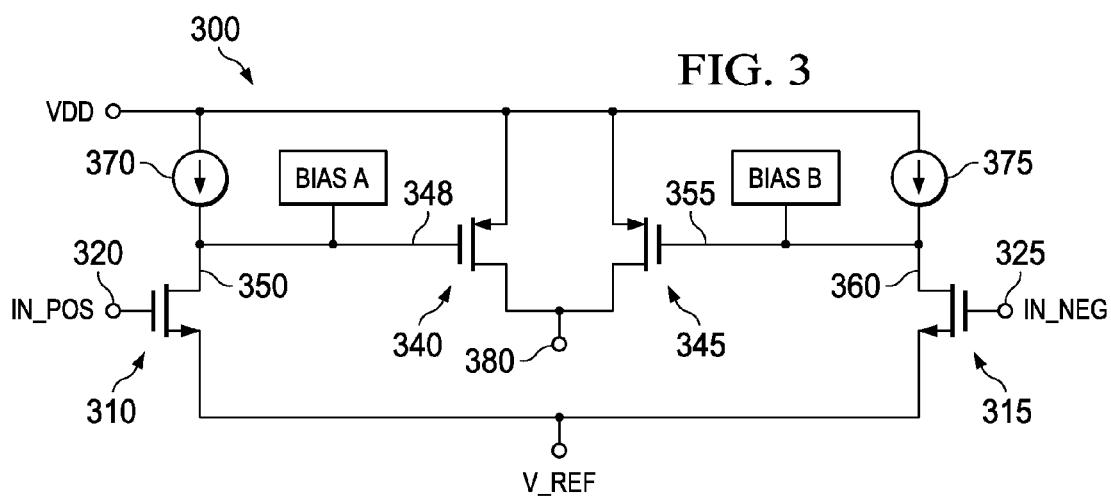
FIG. 3 is a schematic diagram of a quartic-response electrical current source according to various example embodiments.

FIG. 3 is a schematic diagram of a quartic-response electrical current source 300 according to various example embodiments. The current source 300 may be used as a dynamic bias current source in an amplifier as represented by block 135 of FIG. 1. The current source 300, a differential voltage to current converter, includes a first pair of transconductance devices 310 and 315. The transconductance devices 310 and 315 are arranged in an electronic circuit to form a differential input stage of the current source 300. An input 320 of the positive-side first-stage transconductance devices 310 is configured as a positive side of the differential input and an input 325 of the negative-side first-stage transconductance device 315 is configured as a negative side of the differential input.

Each of the transconductance devices 310, 315 is biased to create a second-order relationship between a magnitude of a signal received at the differential input 320, 325 and a magnitude of an output signal associated with an active first-pair transconductance device.

The current source 300 also includes a second pair of transconductance devices 340 and 345 communicatively coupled to the first-stage transconductance devices 310 and 315, respectively. More precisely, the input 348 of the positive-side second-stage transconductance device 340 is communicatively coupled to the output 350 of the positive-side first-stage transconductance device 310. And, the input 355 of the negative-side second-stage transconductance device 345 is communicatively coupled to the output 360 of the negative-side first-stage transconductance device 315. In some embodiments, the second-stage transconductance devices 340 and 345 may be arranged as a long-tailed pair.

The second-stage devices 340 and 345 are biased to create a second-order relationship between the magnitude of signals at the outputs 350 and 360 of the first-stage devices 310 and 315 and the magnitude of an electrical current sourced at the common node 380 corresponding second-stage transconductance devices 340 and 345, respectively.

In the case of MOSFETs as transconductance devices, the first and second stages may be arranged such that current flow through the positive-side second-stage transconductance device 340 is quadratically proportional to the magnitude of the output signal produced at the positive-side first-stage transconductance device 310 when the differential input signal is positive. The current flow through the negative-side second-stage transconductance device 345 may be quadratically proportional to the magnitude of the output signal produced at the negative-side first-stage transconductance device 315 when the differential input signal is negative.

Some embodiments may employ a current source 370 arranged in series between a voltage rail and the current path through the positive-side first-stage transconductance device 310. The current source 370 prevents changes in drain-to-source current at first-stage transconductance device 310. This forces the device 310 to operate within a small-signal, linear range of transconductance. The result is a second-order relationship between the signal received at the input 320 and the output voltage signal produced at the output 350 of the positive-side first-stage transconductance device 310.

Likewise, a current source 375 may be arranged in series between the voltage rail and the current path through the negative-side first-stage transconductance device 315 to force the device 315 to operate within the linear range. Doing so results in a second-order relationship between the signal received at the input 325 and the output voltage signal produced at the output 360 of the negative-side first-stage transconductance device 315.

Figure 4:
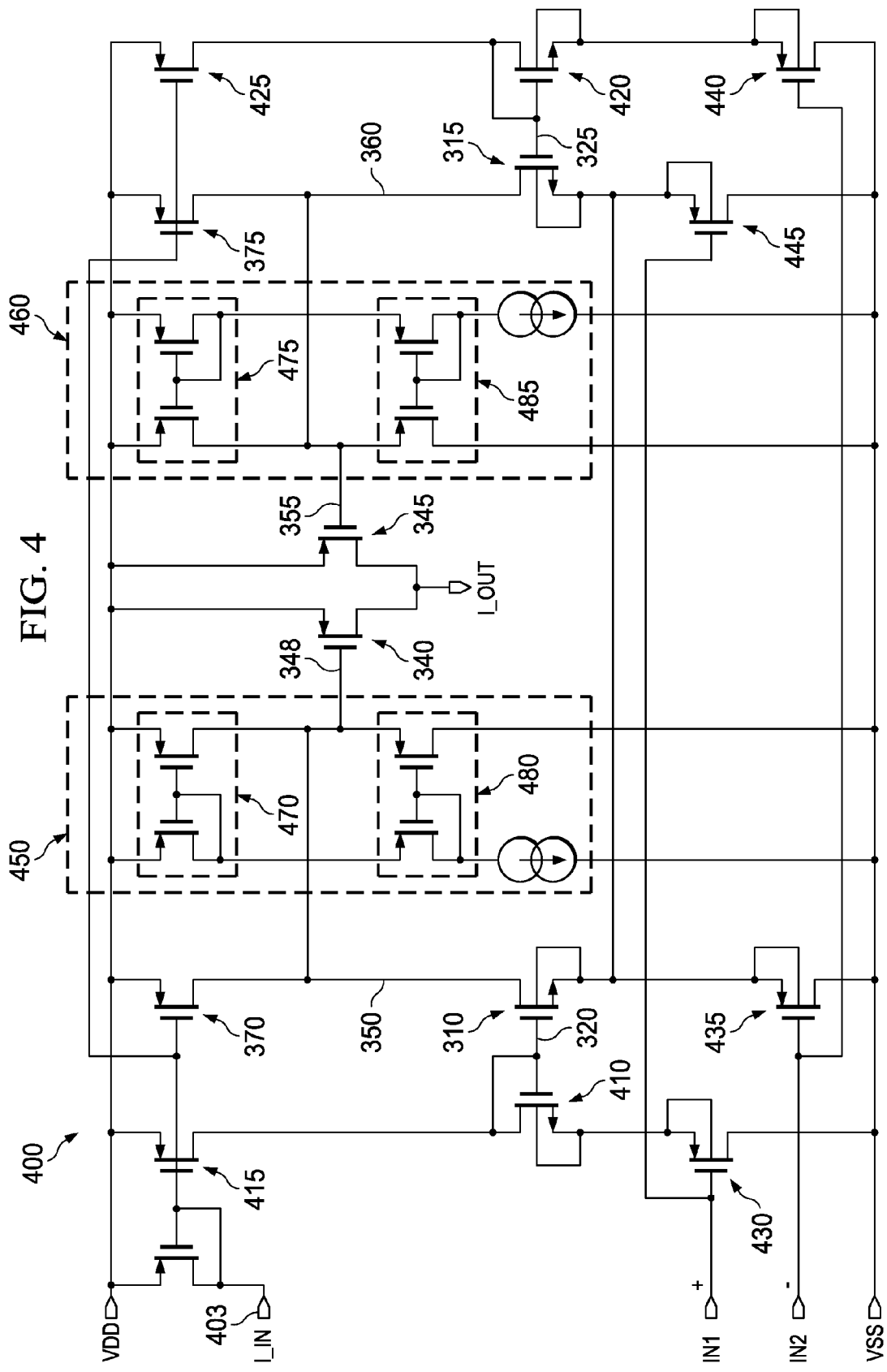
FIG. 4 is a detailed schematic diagram of a quartic-response electrical current source according to various example embodiments.

FIG. 4 is a detailed schematic diagram of a quartic-response electrical current source 400 according to various example embodiments. Positive and negative first-stage transconductance devices 310 and 315, first-stage inputs 320 and 325, first-stage outputs 350 and 360, first-stage current sources 370 and 375, positive and negative second-stage transconductance devices 340 and 345, and second-stage device inputs 348 and 355 are configured as shown in FIG. 3 and operate as described above. A root current source at input 403 is mirrored to various points within the dynamic current source 400 to provide various bias currents.

The current source 400 may also include a positive-side, diode-connected transconductance device 410 communicatively coupled to the input of the first-stage device 310. The device 410 and the current source 415 bias the first-stage device 310 to a linear range of operation. Likewise, a positive-side diode-connected transconductance device 420 may be communicatively coupled to the input of the negative-side first-stage device 315. The device 420 and the current source 425 bias the first-stage device 315 to a linear range of operation.

The current source 400 may also include two positive-side buffering transconductance devices 430 and 435, each communicatively coupled to the positive-side first-stage transconductance device 310. The buffering transconductance devices 430 and 435 receive the differential input signal and operate to increase the magnitude of current flow through the positive-side first-stage device 310 when the differential input signal is positive.

Two negative-side buffering transconductance devices 440 and 445 are communicatively coupled to the negative-side first-stage transconductance device 315. The buffering transconductance devices 440 and 445 receive the differential input signal and operate to increase the magnitude of current flow through the negative-side first-stage device 315 when the differential input signal is negative. The buffering transconductance devices 430, 435, 440, 445 may be configured as source followers.

The current source 400 may also include two second-stage bias networks 450 and 460. A positive-side second-stage bias network 450 may be communicatively coupled to the input of the positive-side second-stage transconductance device 340. In symmetrical fashion, a negative-side second-stage bias network 460 may be communicatively coupled to the input of the negative-side second-stage transconductance device 345. The bias networks 450 and 460 operate to bias the corresponding second-stage transconductance device 340 and 345 to operate within a saturation range of operation and provide a small study-state current output from the current source 400.

In some embodiments, the second-stage bias networks 450 and 460 may include first current mirrors 470 and 475, respectively. The current mirrors 470 and 475 are coupled between the inputs 348 and 355, respectively, of the positive-side and negative-side second-stage transconductance devices 340, 345 and a positive voltage rail. The second stage bias networks 450 and 460 may also include second current mirrors 480 and 485 coupled between the inputs 348 and 355, respectively, of the second-stage transconductance devices 340 and 345 and a negative voltage rail.

Figure 5:
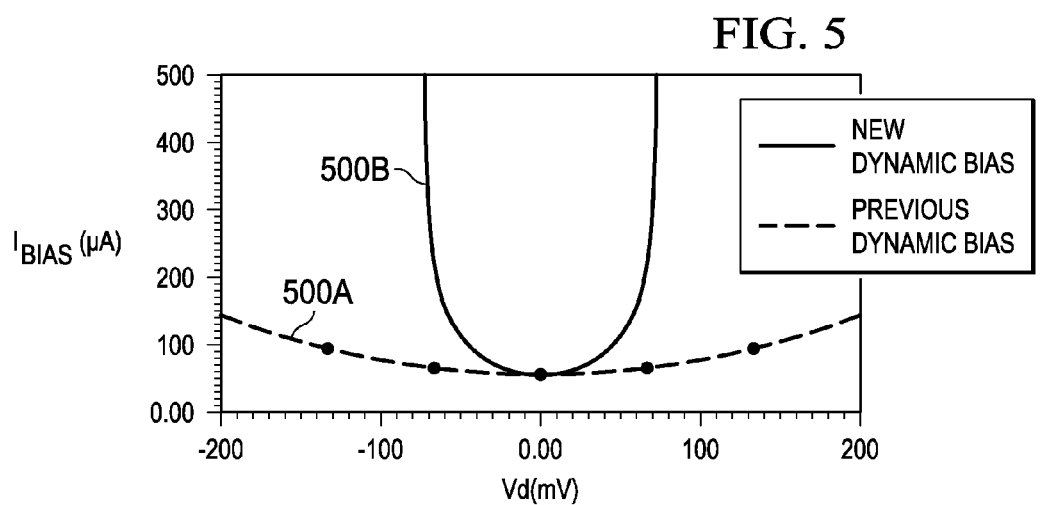
FIG. 5 is a transconductance plot comparing the response of a traditional dynamic bias circuit to the response of the fourth-order dynamic bias circuit disclosed herein.

FIG. 5 is a transconductance plot comparing the response 500A of a traditional dynamic bias circuit to the response 500B of the fourth-order dynamic bias circuit disclosed herein. Plot 500A corresponds to the second-order response shown in FIG. 2 for millivolt-level differential input signals. For points along the traditional millivolt-level response curve 500A, a transconductance tangent line practically overlays each side of the curve itself, as indicated by the tangent lines 215 and 220 of FIG. 2.

Plot 500B, on the other hand, shows the fourth-order transconductance curve representing large amounts of current at very small differential voltage levels as made available by embodiments herein. The ability to source high currents as a function of small signal voltage differences enhances slew rate and may be important to applications such as the example cited above.

Modules and components described herein may include hardware circuitry, optical components, single or multi-processor circuits, memory circuits, and/or computer-readable media with computer instructions encoded therein/thereon capable of being executed by a processor (including non-volatile memory with firmware stored therein but excluding non-functional descriptive matter), and combinations thereof, as desired by the architects of the quartic-response electrical current source 300 and as appropriate for particular implementations of various embodiments.

Apparatus and systems described herein may be useful in applications other than providing a quartic-response dynamic bias current source for use with a linear amplifier. Examples of the quartic-response current sources 300 and 400 are intended to provide a general understanding of the structures of various embodiments. They are not intended to serve as complete descriptions of all elements and features of apparatus and systems that might make use of these structures.

The various embodiments may be incorporated into electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as subcomponents within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may also include one or more methods.

Figure 6:
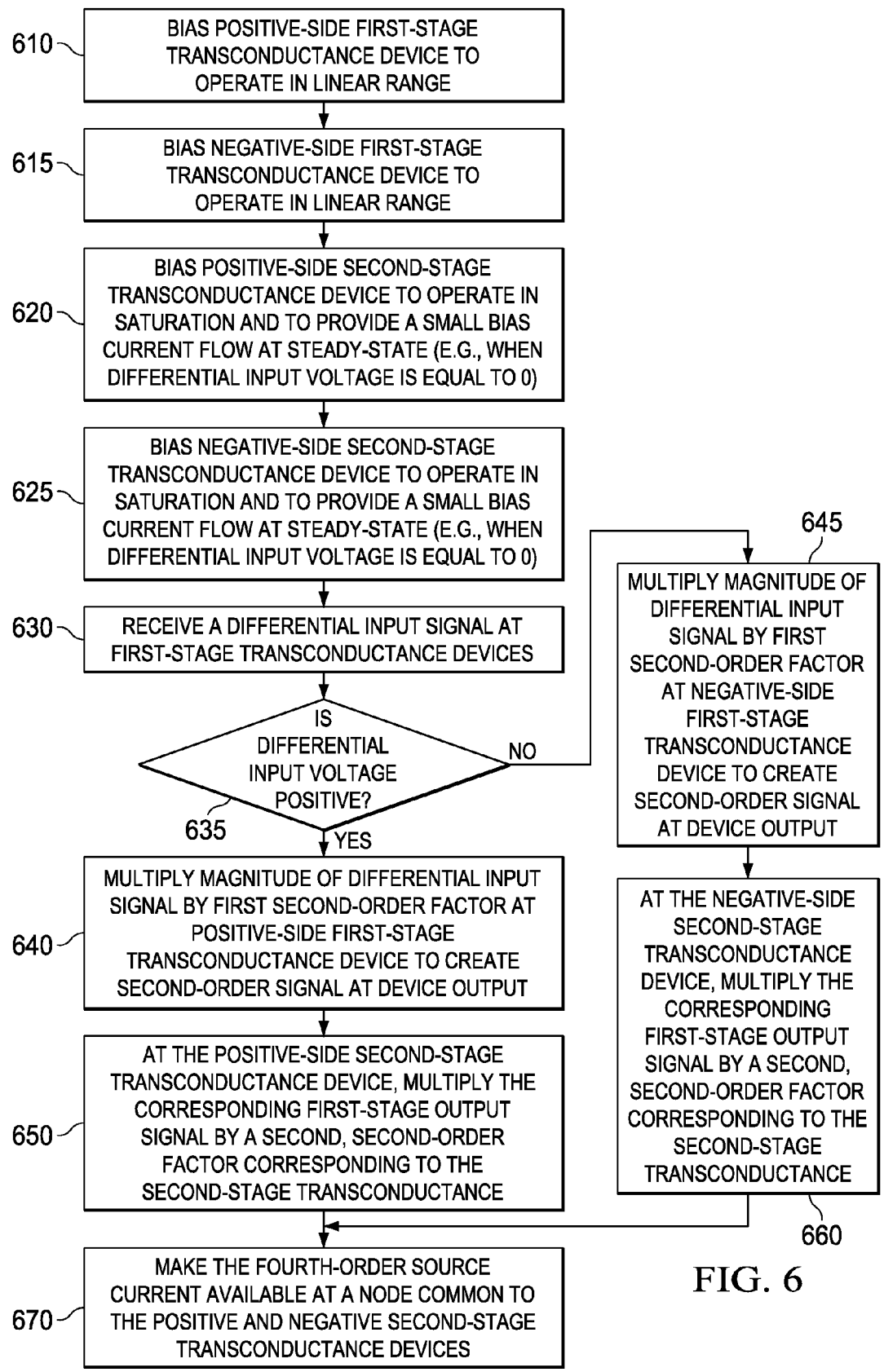
FIG. 6 is a flow diagram illustrating a method of producing a quartic-response electrical current according to various implementations.

FIG. 6 is a flow diagram illustrating a method 600 of producing a quartic-response electrical current according to various implementations. A quartic-response current source may be used in a variety of applications. For example, implementing the method 600 to produce a dynamic bias current source for a linear amplifier may boost performance by increasing amplifier slew rate.

The method 600 may commence at block 610 with biasing a positive-side first-stage transconductance device to operate in the linear range. The method 600 continues at block 615 with biasing a negative-side first-stage transconductance device to operate in the linear range. That is, the first-stage transconductance devices may be biased to operate as small-signal voltage amplifiers.

The method 600 also includes biasing a positive-side second-stage transconductance device to operate in saturation and to provide a small bias current flow at steady-state (e.g., when the differential input voltage is equal to 0), at block 620. The method 600 may further include biasing the negative-side second-stage transconductance device to operate in saturation and to provide a small bias current flow at steady-state (e.g., when the differential input voltage is equal to 0), at block 625.

The method 600 may continue at block 630 with receiving a differential input signal at the first-stage pair of transconductance devices. The method 600 includes determining whether the instantaneous differential input signal is positive or negative, at block 635.

If the input signal is positive, the method 600 includes multiplying the magnitude of the differential input signal by a first second-order factor at the positive-side first-stage transconductance device to create a second-order signal at the device output, at block 640. At the positive-side second-stage transconductance device, the method 600 further includes multiplying the corresponding first-stage output signal by a second, second-order factor corresponding to the second-stage transconductance, at block 650. The method 600 also includes making the resulting fourth-order source current available at a node common to the positive and negative second-stage transconductance devices, at block 670.

If the input signal is negative, as determined at block 635, the method 600 may include multiplying the magnitude of the differential input signal by a first second-order factor at the negative-side first-stage transconductance device to create a second-order signal at the device output, at block 645. At the negative-side second-stage transconductance device, the method 600 also includes multiplying the corresponding first-stage output signal by a second, second-order factor corresponding to the second-stage transconductance, at block 660. At block 670, the method 600 also includes making the resulting fourth-order source current available at the node that is common to the positive and negative second-stage transconductance devices, as described for the positive input signal case.

Apparatus and methods described herein operate as a voltage-controlled current source with an overall fourth-order transconductance response. Used as a quartic response dynamic bias circuit in conjunction with a linear amplifier, these embodiments may increase slew rates in circuits requiring very fast response times. Such applications may include, for example, feedback elements of voltage regulation networks associated with DC-DC power supplies responsible for providing stable power to low-voltage processor circuits with dynamic power requirements.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, similarly-arranged structures calculated to achieve substantially the same purpose are contemplated within the scope of the disclosure. Said differently, this disclosure is intended to cover any and all adaptations or variations of various embodiments.

The Abstract of the Disclosure is provided to comply with 37 C.F.R. §1.72(b) requiring an abstract to allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A quartic-response electrical current source, comprising:
   a first pair of transconductance devices arranged in an electronic circuit to form a differential input stage of a differential voltage to current converter, each first-pair transconductance device biased to create a second-order relationship between a magnitude of a differential input signal received at the differential input and a magnitude of an output signal associated with the first-pair transconductance device; and
   a second pair of transconductance devices arranged to form a second stage of the converter, each second-pair transconductance device communicatively coupled to a corresponding first-pair transconductance device and biased to create a second-order relationship between the magnitude of the output signal associated with the corresponding first-pair transconductance device and a magnitude of an electrical current sourced at the second-pair transconductance device.

2. The quartic-response electrical current source of claim 1,
   an input of a positive-side first-stage one of the first pair of transconductance devices configured as a positive side of the differential input; and
   an input of a negative-side first-stage one of the pair of transconductance devices configured as a negative side of the differential input.

3. The quartic-response electrical current source of claim 2,
   an input of a positive-side second-stage one of the second pair of transconductance devices communicatively coupled to an output of the positive-side first-stage transconductance device; and
   an input of a negative-side second-stage one of the second pair of transconductance devices communicatively coupled to an output of the negative-side first-stage transconductance device.

4. The quartic-response electrical current source of claim 2,
   the first and second-stage transconductance devices arranged such that current flow through the positive-side second-stage transconductance device is quadratically proportional to a magnitude of the output signal produced at the positive-side first-stage transconductance device when the differential input signal is positive; and
   current flow through the negative-side second-stage transconductance device is quadratically proportional to a magnitude of the output signal produced at the negative-side first-stage transconductance device when the differential input signal is negative.

5. The quartic-response electrical current source of claim 2, further comprising:
   a first current source arranged in series between a voltage rail and a current path through the positive-side first-stage transconductance device to enable the second-order relationship between an input signal received at the positive-side first-stage transconductance device and the output signal produced at the output of the positive-side first-stage transconductance device; and
   a duplicate first current source arranged in series between the voltage rail and a current path through the negative-side first-stage transconductance device to enable the second-order relationship between an input signal received at the negative-side first-stage transconductance device and the output signal produced at the output of the negative-side first-stage transconductance device.

6. The quartic-response electrical current source of claim 2, further comprising:
   a positive-side diode-connected transconductance device communicatively coupled to the input of the positive-side first-stage transconductance device to bias the positive-side first-stage transconductance device to a linear range of operation; and
   a negative-side diode-connected transconductance device communicatively coupled to the input of the negative-side first-stage transconductance device to bias the negative-side first-stage transconductance device to the linear range of operation.

7. The quartic-response electrical current source of claim 2, further comprising:

two buffering transconductance devices communicatively coupled to the positive-side first-stage transconductance device to receive the differential input signal and to increase a magnitude of current flow through the positive-side first-stage transconductance device when the differential input signal is positive; and two buffering transconductance devices communicatively coupled to the negative-side first-stage transconductance device to receive the differential input signal and to increase current flow through the negative-side first-stage transconductance device when the differential input signal is negative.

8. The quartic-response electrical current source of claim 7, the buffering transconductance devices configured as source followers.

9. The quartic-response electrical current source of claim 2, further comprising two second-stage bias networks:

a positive-side second-stage bias network communicatively coupled to the input of the positive-side second-stage transconductance device; and a negative-side second-stage bias network connected to an input element associated with the negative-side second-stage transconductance device, each bias network to bias the corresponding second-stage transconductance device to operate within a saturation range of operation.

10. The quartic-response electrical current source of claim 9, each of the two second-stage bias networks comprising:

a first current mirror coupled between the input of the second-stage transconductance device and a positive voltage rail; and a second current mirror coupled between the input of the second-stage transconductance device and a negative voltage rail.

11. The quartic-response electrical current source of claim 1, at least one of the first pair of transconductance devices or the second pair of transconductance devices comprising a semiconductor device.

12. The quartic-response electrical current source of claim 11, the semiconductor device comprising a metal oxide semiconductor field-effect transistor (MOSFET), an input element of at least one of the first or second pair of transconductance devices comprising a MOSFET gate, and the second-order relationships being quadratic.

13. The quartic-response electrical current source of claim 1, the second-stage transconductance devices arranged as a long-tailed pair.

14. A high slew rate amplifier comprising:

a differential amplifier input stage including two amplifier-stage transconductance devices connected as a differential pair to receive a differential input signal;

a first pair of transconductance devices communicatively coupled one-to-one to the amplifier-stage transconductance devices and arranged to form a differential input stage of a differential voltage to current converter, each first-pair transconductance device biased to create a second-order relationship between a magnitude of the differential input signal and a magnitude of an output signal associated with the first-pair transconductance device;

a second pair of transconductance devices arranged to form a second stage of the converter, each second-pair transconductance device communicatively coupled to a corresponding first-pair transconductance device and biased to create a second-order relationship between the magnitude of the output signal associated with the corresponding first-pair transconductance device and a magnitude of current flowing through the second-pair transconductance device; and an output node to direct the current flowing through the second-pair transconductance devices to the differential amplifier input stage as a dynamic bias current, the dynamic bias current proportional to the differential input signal raised to a fourth power.

15. The high slew rate amplifier of claim 14, at least one of the first pair of transconductance devices or the second pair of transconductance devices comprising a metal oxide semiconductor field-effect transistor (MOSFET), an input element of at least one of the first or second pair of transconductance devices comprising a MOSFET gate, and the second-order relationships being quadratic.

16. The high slew rate amplifier of claim 15, the first and second pair of transconductance devices arranged such that:

current flow through a positive-side second-stage transconductance device is quadratically proportional to an output signal produced at a positive-side first-stage transconductance device when the differential input signal is positive; and current flow through a negative-side second-stage transconductance device is quadratically proportional to an output signal produced at a negative-side first-stage transconductance device when the differential input signal is negative.

17. A method of producing a quartic-response electrical current, comprising:

receiving a differential input signal at a first-stage pair of transconductance devices;

multiplying a magnitude of the differential input signal by a first second-order factor at each first-stage transconductance device to create a second-order signal at an output of the first-stage transconductance device; and multiplying the second-order signal by a second second-order factor at each one of a pair of second-stage transconductance devices to create a fourth-order signal at an output of the second-stage transconductance device.

18. The method of producing a quartic-response electrical current of claim 17, the fourth-order signal as an electrical current.

19. The method of producing a quartic-response electrical current of claim 17, further comprising:

biasing each of the first-stage transconductance devices to a linear range of operation; and biasing each of the second-stage transconductance devices to a saturation range of operation.

20. The method of producing a quartic-response electrical current of claim 17, further comprising:

operating each of the first-stage transconductance devices as a small-signal voltage amplifier.

* * * * *